US012765297B2

(12) United States Patent
Lu et al.

(10) Patent No.: US 12,765,297 B2
(45) Date of Patent: Oct. 13, 2026

(54) PROTECTION LAYER FORMATION DURING PLASMA ETCHING CONDUCTIVE MATERIALS

(71) Applicant: Tokyo Electron Limited, Tokyo (JP)

(72) Inventors: Yen-Tien Lu, Albany, NY (US); Shihsheng Chang, Albany, NY (US); Nicholas Joy, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 715 days.

(21) Appl. No.: 18/312,427

(22) Filed: May 4, 2023

(65) Prior Publication Data

US 2024/0371655 A1 Nov. 7, 2024

(51) Int. Cl.

| | |
|---|---|
| ***H10P 50/00*** | (2026.01) |
| ***H10P 14/60*** | (2026.01) |
| ***H10P 14/692*** | (2026.01) |
| ***H10P 50/26*** | (2026.01) |
| ***H10P 76/40*** | (2026.01) |
| ***H10W 74/01*** | (2026.01) |

(52) U.S. Cl.

CPC .......... *H10P 50/71* (2026.01); *H10P 14/6306* (2026.01); *H10P 14/6336* (2026.01); *H10P 14/6681* (2026.01); *H10P 14/69215* (2026.01); *H10P 50/268* (2026.01); *H10P 76/405* (2026.01); *H10W 74/01* (2026.01)

(58) Field of Classification Search

None

See application file for complete search history.

(56) References Cited

U.S. PATENT DOCUMENTS

| | | | |
|---|---|---|---|
| 6,541,380 | B2 | 4/2003 | Mng et al. |
| 9,391,267 | B2 | 7/2016 | Shen et al. |
| 9,881,794 | B1 | 1/2018 | Su |
| 10,633,743 | B2 | 4/2020 | Chen et al. |
| 2007/0026677 | A1 | 2/2007 | Ji et al. |
| 2016/0163557 | A1 | 6/2016 | Hudson et al. |
| 2016/0308112 | A1 | 10/2016 | Tan et al. |
| 2017/0125261 | A1 | 5/2017 | Miyama et al. |

(Continued)

FOREIGN PATENT DOCUMENTS

KR 20160124689 A 10/2016

OTHER PUBLICATIONS

International Search Report and Written Opinion, PCT/US2024/017002, mailed Jun. 4, 2024, Total pp. 11.

(Continued)

*Primary Examiner* — Stephanie P Duclair

(74) *Attorney, Agent, or Firm* — Slater Matsil, LLP

(57) ABSTRACT

A method of processing a substrate that includes: forming a patterned hardmask layer over a conductive layer to be etched, the conductive layer disposed over a substrate; and patterning the conductive layer using the patterned hardmask layer as an etch mask, by performing a cyclic plasma etch process to gradually form a recess in the conductive layer, each cycle of the cyclic plasma etch process including exposing the substrate to a first plasma including a halogen to etch the conductive layer, and exposing the substrate to a second plasma including a silicon-containing precursor to deposit a silicon-containing protective layer over a top surface of the patterned hardmask layer.

20 Claims, 7 Drawing Sheets

(56) References Cited

U.S. PATENT DOCUMENTS

| | | | | |
|---|---|---|---|---|
| 2019/0088497 | A1 | 3/2019 | Kitagaito et al. | |
| 2021/0118693 | A1 | 4/2021 | Joy et al. | |
| 2021/0313192 | A1* | 10/2021 | Joy | H01J 37/32449 |
| 2021/0391181 | A1* | 12/2021 | Chang | H10P 50/283 |
| 2022/0059365 | A1* | 2/2022 | Fung | H10P 50/266 |
| 2022/0208556 | A1 | 6/2022 | Tirukkonda et al. | |
| 2023/0049714 | A1* | 2/2023 | Chiang | H10P 50/266 |

OTHER PUBLICATIONS

Kiehlbaugh, K., "Halogen-Based Plasma Etching of Novel Field-Effect Transistor Gate Materials," Dissertation submitted to the University of California, Berkeley, Fall 2009, 209 pages.

* cited by examiner

PROTECTION LAYER FORMATION DURING PLASMA ETCHING CONDUCTIVE MATERIALS

TECHNICAL FIELD

The present invention relates generally to methods of processing a substrate, and, in particular embodiments, to protection layer formation during plasma etching conductive materials.

BACKGROUND

Generally, semiconductor devices used in electronics, such as mobile phones, digital cameras, and computers, are fabricated by sequentially depositing and patterning layers of dielectric, conductive, and semiconductor materials over a semiconductor substrate, using photolithography and etching to form structures that function as circuit components (e.g., transistors, resistors, and capacitors) and as interconnect elements (e.g., conductive lines, contacts and vias). Driven by a demand for low-cost electronics, the semiconductor industry has repeatedly reduced the minimum feature sizes in semiconductor devices to a few nanometers with innovations in lithography (e.g., immersion lithography and multiple patterning) to increase the packing density of components, thereby reducing the cost of integrated circuits (ICs). Further increase in density and reduction in cost is achieved using three-dimensional (3D) structures (e.g., the fin field-effect transistors (FinFET)) and, in some instances, stacking electronic components such as memory storage elements (e.g., the ferroelectric capacitor, the magnetic tunnel junction (MTJ), etc.) and precision passive components (e.g., the thin-film resistor (TFR) and the metal-insulator-metal (MIM) capacitor) in layers in between successive interconnect levels.

Plasma processing techniques, such as reactive ion etching (RIE), plasma-enhanced chemical vapor deposition (PECVD), plasma-enhanced atomic layer etch and deposition (PEALE and PEALD), sputter etch, physical vapor deposition (PVD), and cyclic etch-deposition (e.g., the Bosch etch process) have become indispensable in fabricating ICs. The diversity of materials used in IC fabrication such as semiconductors, insulators (including $SiO_2$, $Si_3N_4$, high-k gate dielectrics, and low-k dielectrics), magnetic and ferroelectric films, and metals for interconnect and electrodes makes developing plasma processes, and generally fabrication processes, a challenge. Miniaturization to a few nanometers has intensified the challenge. Furthermore, introduction of unconventional materials (e.g., Co and Ru) at feature sizes below 20 nm may raise new issues in developing desired etch and deposition processes compatible with conventional Si IC fabrication.

SUMMARY

In accordance with an embodiment of the present invention, a method of processing a substrate that includes: forming a patterned hardmask layer over a conductive layer to be etched, the conductive layer disposed over a substrate; and patterning the conductive layer using the patterned hardmask layer as an etch mask, by performing a cyclic plasma etch process to gradually form a recess in the conductive layer, each cycle of the cyclic plasma etch process including exposing the substrate to a first plasma including a halogen to etch the conductive layer, and exposing the substrate to a second plasma including a silicon-containing precursor to deposit a silicon-containing protective layer over a top surface of the patterned hardmask layer.

In accordance with an embodiment of the present invention, a method of processing a substrate that includes: forming a patterned hardmask layer over a conductive layer to be etched, the conductive layer disposed over a substrate; flowing a halogen-containing etch gas into a plasma processing chamber, the substrate being loaded in the plasma processing chamber; while flowing the halogen-containing etch gas, sustaining a plasma generated from the halogen-containing etch gas in the plasma processing chamber; etching the conductive layer using the patterned hardmask layer as an etch mask by exposing the substrate to the plasma; while flowing the halogen-containing gas, flowing a silicon-containing precursor into the plasma processing chamber to modify a composition of the plasma; depositing a silicon-containing layer over a top surface of the patterned hardmask layer by exposing the substrate to the modified plasma; and repeating the etching and the depositing.

In accordance with an embodiment of the present invention, a method of processing a substrate that includes: forming a patterned hardmask layer over a conductive layer to be etched, the conductive layer disposed over a substrate, the conductive layer including ruthenium, the patterned hardmask layer including silicon, the substrate including a etch stop layer (ESL) underlying the conductive layer; and patterning the conductive layer using the patterned hardmask layer as an etch mask, by performing a cyclic plasma etch process in a plasma processing chamber to gradually form a recess in the conductive layer, each cycle of the cyclic plasma etch process including sustaining a plasma including an etchant, exposing the substrate to the plasma, the etchant etching the conductive layer, while the exposing, flowing a silicon-containing precursor to the plasma processing chamber to form a protective layer over a top surface of the patterned hardmask layer, and stopping the flow of silicon-containing precursor to stop the formation of the protective layer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1F illustrate cross sectional views of a substrate during an example process of semiconductor fabrication comprising a cyclic plasma etch process to form a recess in a conductive layer on the substrate in accordance with various embodiments, wherein FIG. 1A illustrates an incoming substrate comprising a conductive layer to be etched, FIG. 1B illustrates the substrate after an initial etch step, FIG. 1C illustrates the substrate after a first deposition step, FIG. 1D illustrates the substrate after a second etch step, FIG. 1E illustrates the substrate after a second deposition step, FIG. 1F illustrates the substrate after completing the cyclic plasma etch process;

FIGS. 3A-3C illustrate process flow diagrams of methods of cyclic plasma etch process to form a recess in a conductive layer in accordance with various embodiments, wherein FIG. 3A illustrates an embodiment, FIG. 3B illustrates an alternate embodiment, and FIG. 3C illustrates yet another embodiment.

DETAILED DESCRIPTION OF ILLUSTRATIVE EMBODIMENTS

This application relates to a method of processing a substrate, more particularly to cyclic plasma etch process to form a recess in a conductive layer. Etching conductive materials such as refractory metal (e.g. ruthenium, tungsten, and molybdenum) and their compounds may be useful in various semiconductor device fabrication processes including metal interconnect formation in back end of line (BEOL) process. Ruthenium (Ru), for example, is a leading candidate for replacing copper of conventional metal interconnects owing to its lower diffusivity. However, removing Ru using chemical mechanical polish (CMP) is difficult and expensive. It is, therefore, desirable to have an efficient direct plasma etching technique to remove Ru and other conductive materials. Although a plasma process using oxygen-based etch chemistry, halogen-based etch chemistry, or their combination may be able to etch Ru, the inherent etch resistance of metals tends to require aggressive plasma etch condition, which often leads to poor etch mask selectivity. This poor etch mask selectivity can adversely affect the etch profile. For example, when the thickness of an etch mask layer is increased, the directionality of plasma etching may be compromised, resulting in tapered or bowed etch profiles.

Various embodiments of the plasma etching methods for conductive materials described in this disclosure are based on cyclic plasma etching that includes a deposition step to form a protective layer to improve the overall etch mask selectivity. During the deposition step, a precursor gas (e.g., silicon tetrachloride) may be flowed in addition to an etch process gas (e.g., halogen-containing gas) that etches a conductive material (e.g., Ru), and the protective layer may be selectively deposited over a top surface of an etch mask layer. The protective layer can function as an additional etch mask, thereby advantageously reducing the consumption of the etch mask layer. Etch and deposition steps may be cyclically repeated to gradually extend a recess in the conductive material to a target depth while replenishing the protective layer by the cycles. The cyclic plasma etch process may advantageously minimize the mask corner erosion and preserve a sufficient portion of the etch mask layer after the process. In addition, bowing and tapered etch profile may also be suppressed.

Figure 2:
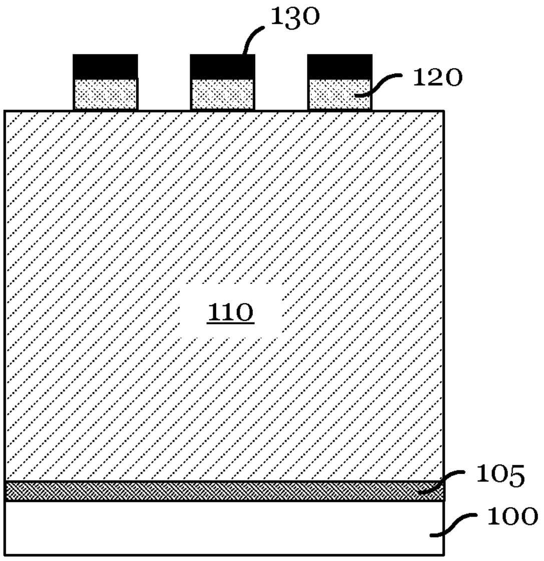
FIG. 2 illustrates a cross sectional view of another substrate after a first deposition step of the cyclic plasma etch process in accordance with another embodiment.
Figure 3A:
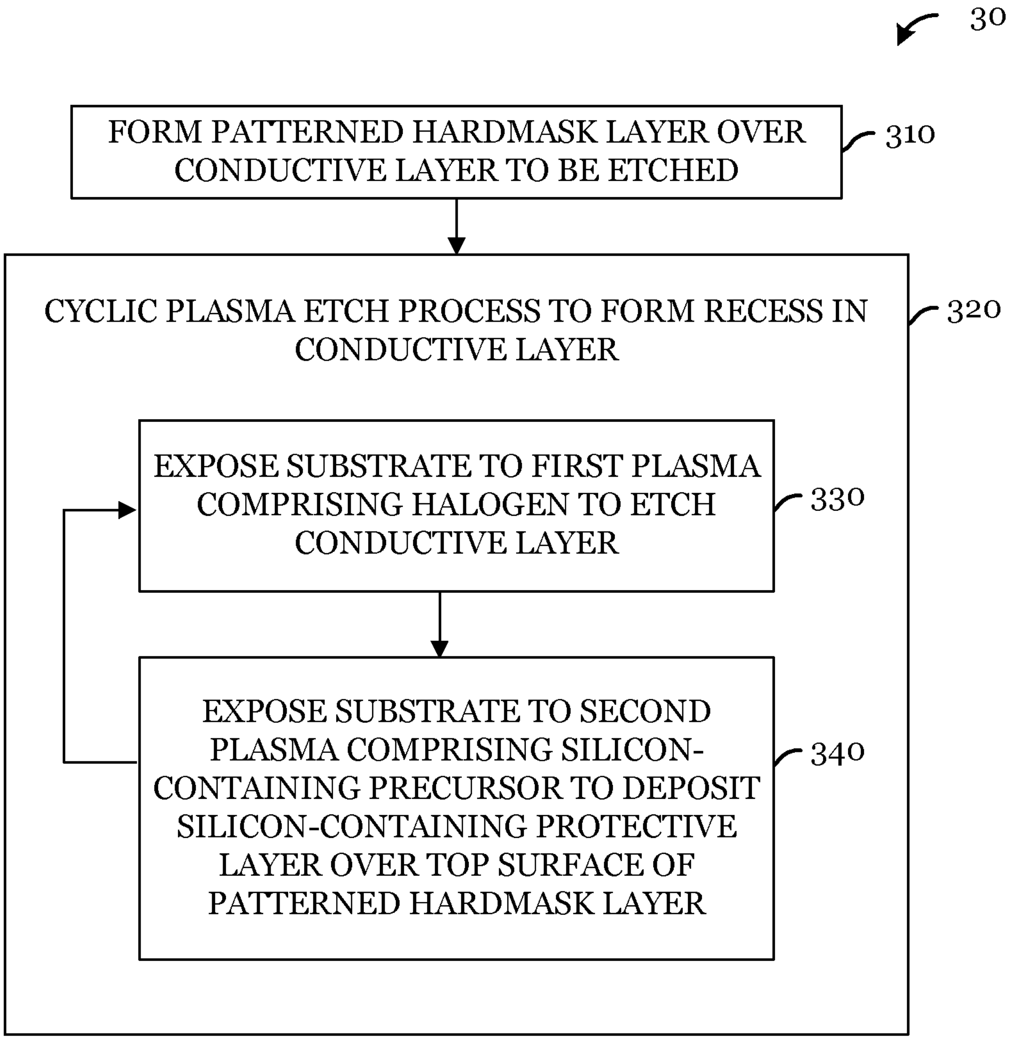
Figure 3B:
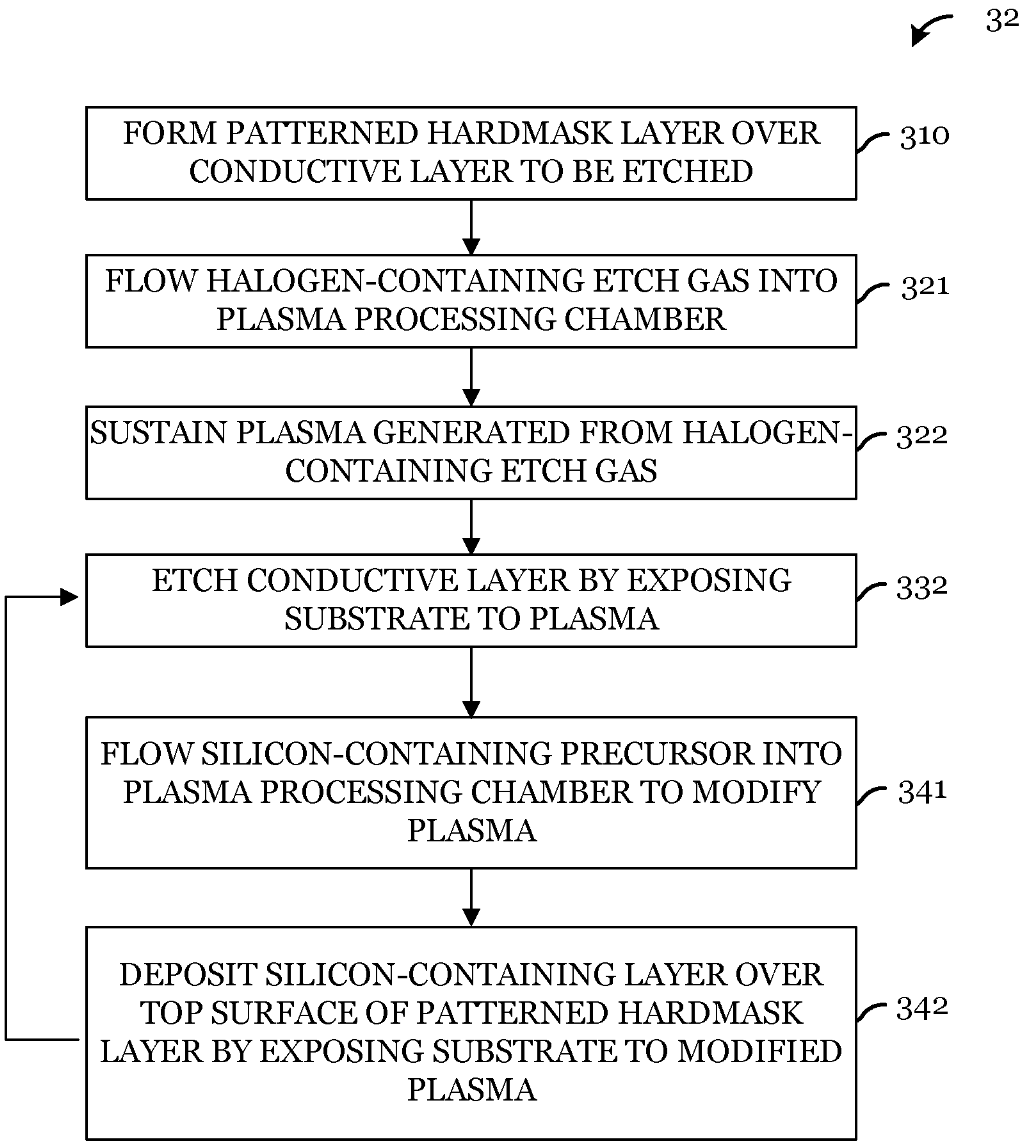
Figure 3C:
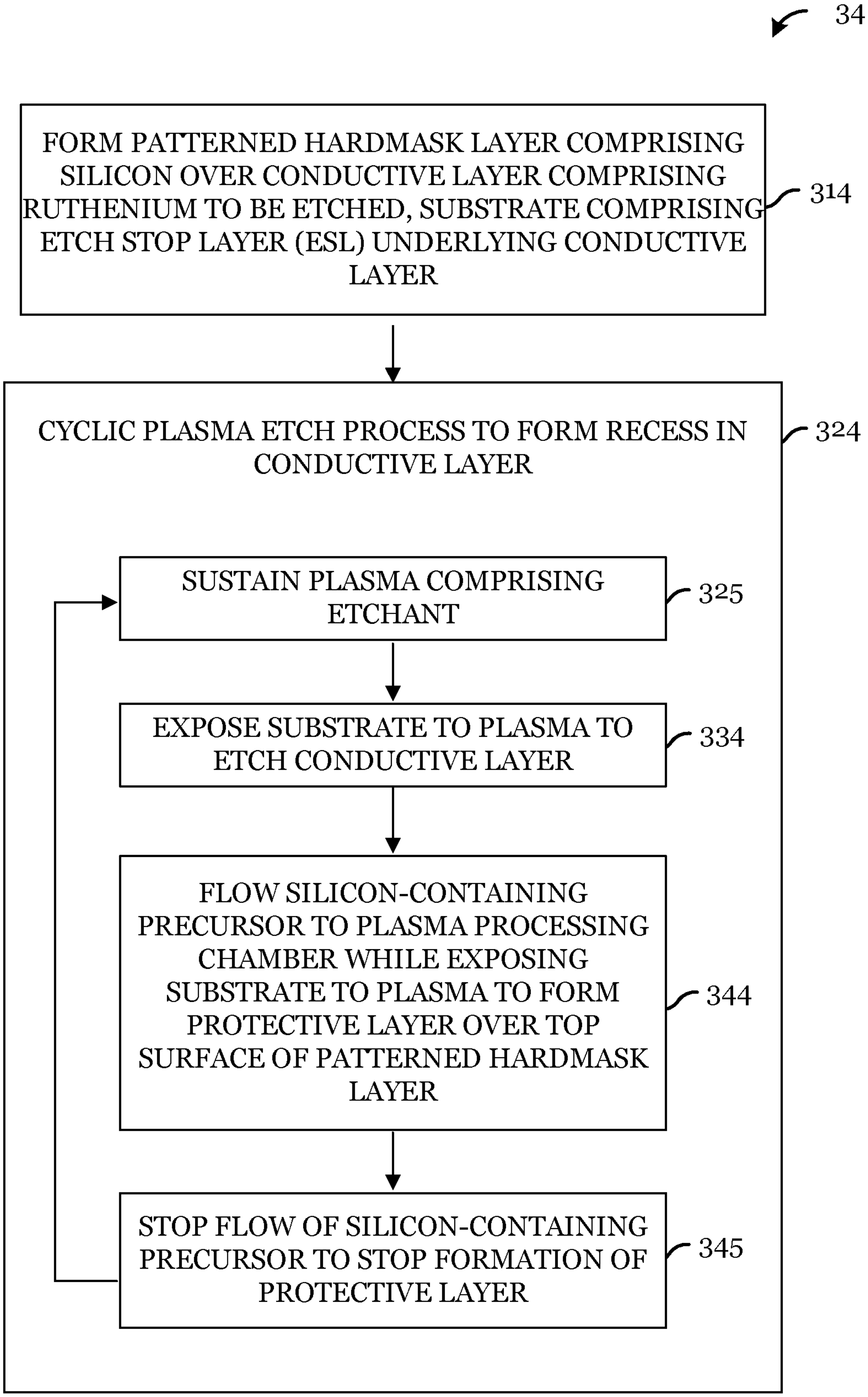
Figure 4:
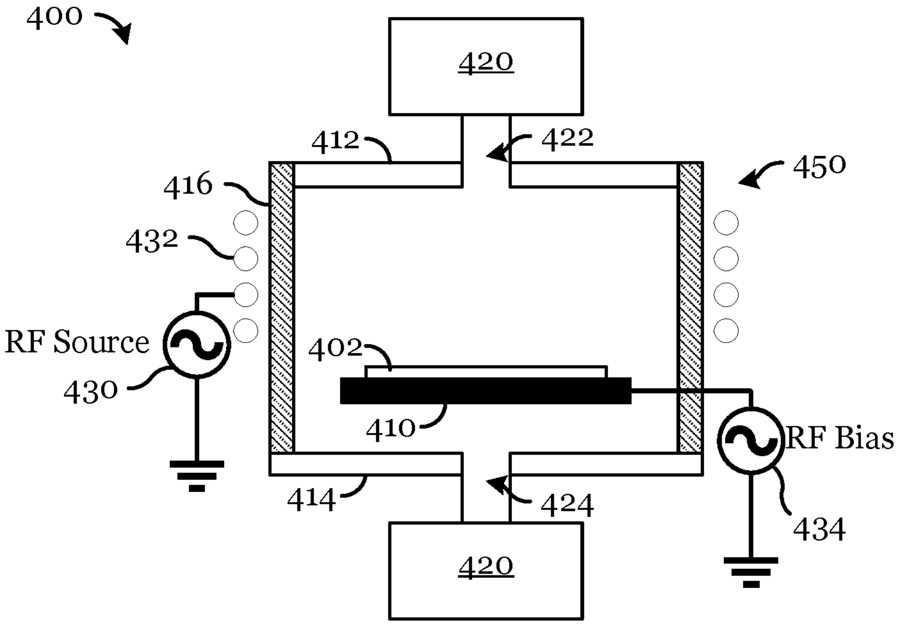
FIG. 4 illustrates a plasma processing system for performing a process of semiconductor fabrication in accordance with various embodiments.

In the following, steps of a cyclic plasma etch process are first described referring to FIGS. 1A-1F in accordance with various embodiments. Another embodiment with deposition-first method is illustrated in FIG. 2. Example process flow diagrams are illustrated in FIG. 3A-3C. FIG. 4 illustrates an example plasma system in accordance with an embodiment. All figures in this disclosure are drawn for illustration purpose only and not to scale, including the aspect ratios of features.

FIGS. 1A-1F illustrate cross sectional views of a substrate during an example process of semiconductor fabrication comprising a cyclic plasma etch process to form a recess in a conductive layer on the substrate in accordance with various embodiments. In various embodiments, the cyclic plasma process may repeat an etch step (FIGS. 1B and 1D) and a deposition step (FIGS. 1C and 1E) to gradually extend the recess. In various embodiments, the etch and deposition steps may be cyclically repeated to achieve a desired recess feature as further described below.

Figure 1A:
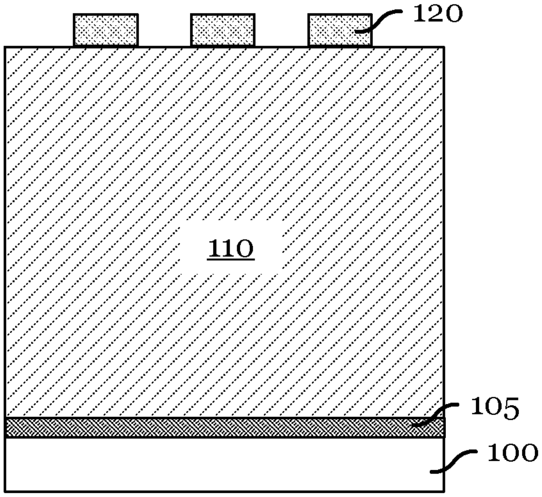

FIG. 1A illustrates a cross-sectional view of an incoming substrate 100. In various embodiments, the substrate 100 may be a part of, or include, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As illustrated in FIG. 1A, a conductive layer 110 may be formed over the substrate 100 and an etch stop layer (ESL) 105 may underlie the conductive layer 110. In various embodiments, the conductive layer 110 may comprise a refractory metal such as ruthenium (Ru), tungsten (W), molybdenum (Mo), niobium (Nb). In certain embodiments, the conductive layer 110 may comprise other metals such as nickel (Ni), aluminum (Al), or alloys such as NiAl. In one embodiment, the conductive layer 110 may comprise metallic Ru. In certain embodiments, the conductive layer 110 may comprise a compound of a metal hard mask such as tungsten silicide (WSi) and tungsten silicon nitride (WSiN). The conductive layer 110 may comprise more than one conductive material. The conductive layer 110 may be the target layer to be etched and fabricated to form various conductive components of a semiconductor device, for example, metal interconnects and contacts. In various embodiments, the etching of the conductive layer 110 may be a part of the back end of line (BEOL) process.

Accordingly, a recess feature to be formed in the conductive layer 110 by the cyclic plasma etch process may comprise a line recess, contact hole, slit, or other suitable structures comprising a recess. In certain embodiments, the recess feature to be formed in the conductive layer 110 may be a high aspect ratio (HAR) feature having an aspect ratio between 3:1 and 6:1.

The conductive layer 110 may be deposited using an appropriate technique such as electroplating or vapor deposition including physical vapor deposition (PVD) and atomic layer deposition (ALD), chemical vapor deposition (CVD), and plasma enhanced chemical vapor deposition (PECVD). In one embodiment, the conductive layer 110 has a thickness between 30 nm and 100 nm.

Still referring to FIG. 1A, a patterned hardmask layer 120 may be over the conductive layer 110 as an etch mask to be used during the cyclic plasma etch process. In various embodiments, the patterned hardmask layer 120 may comprise silicon oxide, silicon nitride, amorphous silicon, or other silicon-based mask materials. In various embodiments, the patterned hardmask layer 120 may be formed by first depositing a hardmask layer over the conductive layer 110 using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. The deposited hardmask layer may then be patterned using a lithography process and an anisotropic etch process. In various embodiments, the patterned hardmask layer 120 may define a pattern to be transferred to the conductive layer 110. In one embodiment, the pattern may comprise a line recess pattern with a pitch size between 10 nm and 50 nm. In one embodiment, the patterned hardmask layer 120 has a thickness between 10 nm and 40 nm. The thickness of the patterned hardmask layer 120 may be selected in consideration of the balance between the etch mask selectivity and etch performance. For example, a sufficient thickness may be necessary to avoid consuming all the hardmask material before completing the cyclic plasma etch process, but when the hardmask layer is too thick, it may cause tapered etch profile and bowing issues. In one embodiment, the thickness of the patterned hardmask layer 120 may be a half of the thickness of the conductive layer 110 or less.

The patterned hardmask layer 120 and/or the conductive layer 110 may be collectively considered as a part of the substrate 100. Further, the substrate 100 may also comprise other layers. For example, for the purpose of patterning the hardmask layer, a tri-layer structure comprising a photoresist layer, SiON layer, and optical planarization layer (OPL) may be present.

In various embodiments, the ESL 105 may comprise metal nitride such as titanium nitride (TiN) and tantalum nitride (TaN). The ESL 105 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. In certain embodiments, the thickness of the ESL 105 may be between 1 nm to 2 nm. In certain embodiments, the ESL 105 may be optional and absent in the substrate 100.

Figure 1B:
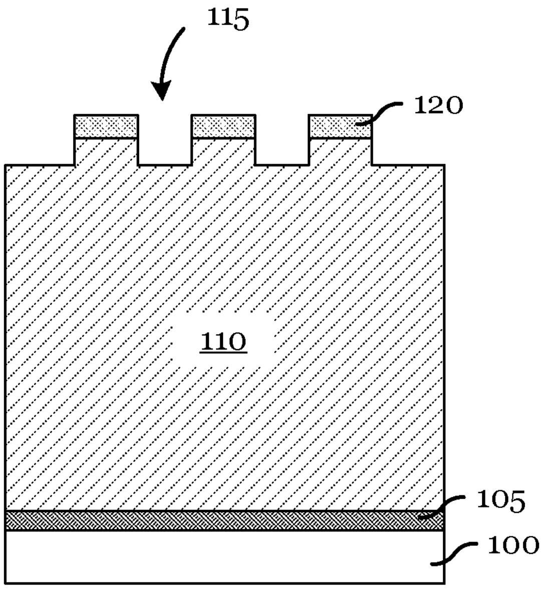

FIG. 1B illustrates a cross-sectional view of the substrate 100 after an initial etch step.

In FIG. 1B, the initial etch step may form recesses 115 in the conductive layer 110. In various embodiments, the cyclic plasma etch process may use halogen-based etch chemistry, oxygen-based etch chemistry, or combination thereof. For example, dichlorine ($Cl_2$) or dioxygen ($O_2$) may be used as a primary etch process gas. In certain embodiments, a noble gas may also be flowed as a carrier gas. The noble gas may comprise helium (He), neon (Ne), argon (Ar), krypton (Kr), xenon (Xe), or radon (Rn). In one or more embodiment, other gases such as dinitrogen ($N_2$) may also be flowed as an additive gas. The etch process gas composition and their flow rates may be selected in consideration of the target conductive material to be etched and optimized for the etch rate and selectivity. For example, in one embodiment, a $Cl_2/O_2$ mixture with an optional $N_2$ addition may be used for etching Ru. In another embodiment, a $Cl_2/N_2$ mixture with an optional $O_2$ or tetrafluoromethane ($CF_4$) addition may be used for etching WSi or WSiN. In yet another embodiment, a $Cl_2/CF_4/O_2$ mixture with an optional hydrogen bromide (HBr) may be used for etching Mo.

In various embodiments, the initial etch step may be performed for only a short process time period, for example, between 5 sec and 2 min, to limit the etching amount of the conductive layer 110 at this stage. A short initial etch step may be desirable because a single, continuous plasma etching condition for the conductive layer 110 may not be sufficiently selective to the etch mask (e.g., the patterned hardmask layer 120 in FIG. 1A) and lead to several etch profile issues. Generally, etching conductive materials such as refractory metals may require aggressive plasma etch condition compared to some other dielectric materials such as silicon oxide. As a result, an extended process time for etching may cause, for example, reduction in critical dimension (CD) and even sputtering of the hard mask material. The remaining hard mask height after the etching may also be insufficient for the downstream operations. When the mask height is increased to address some of these issues, the process may then suffer from tapered etch profile and bowing because the directionality (anisotropy) of the etching can be adversely affected by the thick hardmask layer.

The inventor of this application identified that the cyclic plasma etch process incorporating a deposition step to form a protective layer may advantageously improve the overall etch mask selectivity of the process and therefore overcome some of these issues in plasma etching of conductive materials. The deposition step may be realized by modifying the process gas composition flowed into the plasma processing chamber as described below (FIG. 1C).

Figure 1C:
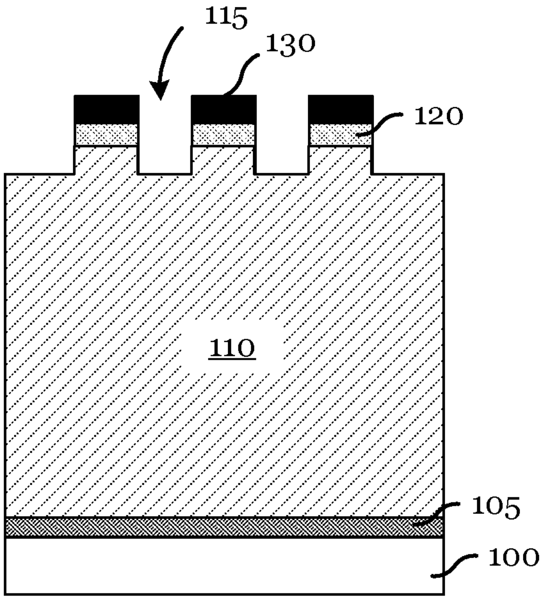

FIG. 1C illustrates a cross-sectional view of the substrate 100 after a first deposition step.

In various embodiments, for the first or any subsequent deposition step, the plasma condition may be modified from the initial etch step by introducing a deposition gas comprising a deposition precursor in addition to the etch process gas used for the initial etch step. Gas flow rates of the etch process gas may be kept constant or modified from the initial etch step. In other embodiment, the process etch gas may be completely switched to the deposition gas.

In certain embodiments, the deposition precursor may comprise a silicon-containing precursor such as silicon tetrachloride ($SiCl_4$) or silicon tetrafluoride ($SiF_4$) and thereby the protective layer 130 may comprise a silicon-based material. In alternate embodiments, other silicon-containing precursor, for example, silicon tetrabromide ($SiBr_4$) may be used. In one embodiments, the protective layer 130 may comprise silicon oxide. The deposition precursor may polymerize and form a protective layer 130 selectively on the top surface of the patterned hardmask layer 120.

The material for the protective layer 130 may be selected to be same as or similar to the hardmask material (i.e., the patterned hardmask layer 120). Accordingly, in certain embodiments, the boundary between the two layers may not be distinguishable, although FIG. 1C illustrates two distinct layers for illustration purpose. In one embodiment, both the hardmask material (i.e., the patterned hardmask layer 120) and the protective layer 130 may comprise silicon oxide.

In FIG. 1C, the top selective deposition of the protective layer 130 is illustrated. This may be enabled by applying deposition conditions with anisotropy and chemical selectivity to minimize the deposition on sidewalls and over the surface of the conductive layer 110. In certain embodiments, although not specifically illustrated in FIG. 1C, some deposition over areas other than the top surface of the patterned hardmask layer 120 may still occur.

In various embodiments, the first or any subsequent deposition step may be an anisotropic or isotropic process, according to implementation objectives. Further, it may be a plasma process or non-plasma process. In certain embodiments, although not specifically illustrated, the deposition of the protective layer 130 on these two surfaces may still occur. In one embodiment, the protective layer 130 may have a first thickness over the top surface of the patterned hardmask layer 120 and a second thickness over the sidewalls or the surface of the conductive layer 110, where the first thickness is greater than the second thickness. The protective layer 130 can serve as an additional etch mask during one or more subsequent etch steps.

In certain embodiments, the first or any subsequent deposition step is a one-step continuous plasma process; however, any suitable process may be used for depositing the protective layer 130, including, for example, a multi-step atomic layer deposition process.

In one or more embodiments, prior to a subsequent etch step, an optional oxygen treatment may be performed to modify the chemical composition of the protective layer 130. The optional treatment may increase the oxygen content of the protective layer 130, for example, converting a Si-based layer into more silicon oxide-rich layer. The optional oxygen treatment may be performed by a plasma or non-plasma process using an oxidant such as dioxygen ($O_2$) and ozone ($O_3$). In certain embodiments where the etch process gas already comprises sufficient oxygen species (e.g., $O_2$ flow), such an optional treatment may not be necessary.

In another embodiment, an optional treatment may also be tuned to introduce elements in addition to or in place of oxygen to the protective layer 130. For example, a nitrogen-containing agent may be used during the optional treatment to introduce nitrogen to the protective layer 130 such that it may comprise silicon nitride or silicon oxynitride.

Figure 1D:
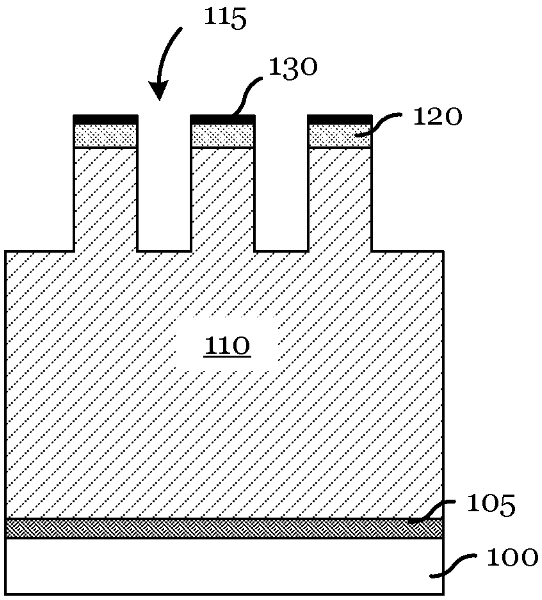

FIG. 1D illustrates a cross-sectional view of the substrate 100 after a second etch step.

After the first deposition step, the second etch step may be performed to extend the recesses 115 using the remaining portion of the patterned hardmask layer 120 and the protective layer 130 as a combined etch mask. In various embodiments, the process may be switched from the first deposition step to the second etch step by stopping the gas flow of the deposition gas to recover the initial etching conditions of the initial etch step. In certain embodiments, the initial etch step and the second or any subsequent etch steps may be performed using the same etch process gas. Alternately, one or more etch steps may use a different process gas and condition.

The protective layer 130 deposited over the top surface of the patterned hardmask layer 120 may improve the etch performance in several ways. For example, it may reduce or eliminate corner erosion of the patterned hardmask layer 120, helping minimizing the CD widening as the etching continues. Further, the improved preservation of the etch mask may reduce ion scattering, reducing or eliminating bowing along the vertical profile of the recesses 115. In addition, the protective layer 130 may partially or wholly compensate for possible loss to the patterned hardmask layer 120. In one embodiment, when the protective layer 130 covers a portion of the sidewalls, this sidewall portion may also advantageously provide sidewall protection and reduce or eliminate bowing along the vertical profile of the recesses 115.

In various embodiments, the protective layer 130 may still be etched by the plasm during the second or any subsequent etch steps, resulting in a thinning of the protective layer 130 as illustrated in FIG. 1D. In certain embodiments, during one or more etch steps, the conductive layer 110 may be etched at a first etch rate and the protective layer 130 may be etched at a second etch rate slower than the first etch rate. In one or more embodiments, the first etch rate may be at least twice the second etch rate (i.e., the etch selectivity of 2 or greater).

Accordingly, in various embodiments, the process time for the second etch step may be selected to avoid a complete loss of the protective layer 130. In one embodiment, the second etch step may be longer than the initial etch step, but in other embodiments, it may be the same or shorter than the initial etch step. Advantageously, cyclically repeating the deposition step, the protective layer 130 may be replenished to maintain the overall etch mask selectivity and etch performance.

Figure 1E:
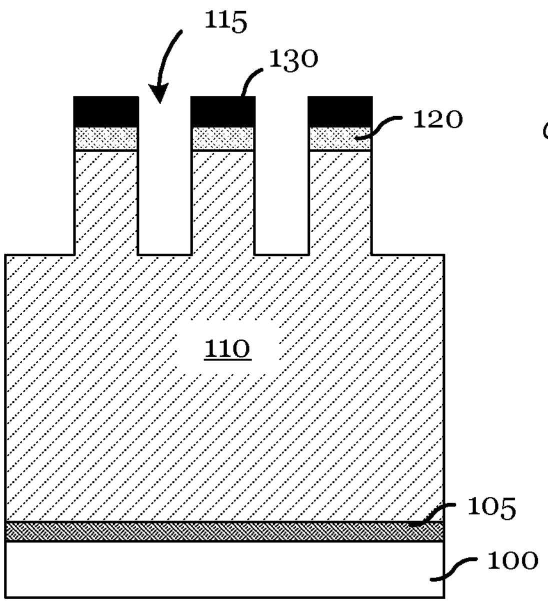

FIG. 1E illustrates a cross-sectional view of the substrate 100 after a second deposition step.

Figure 1F:
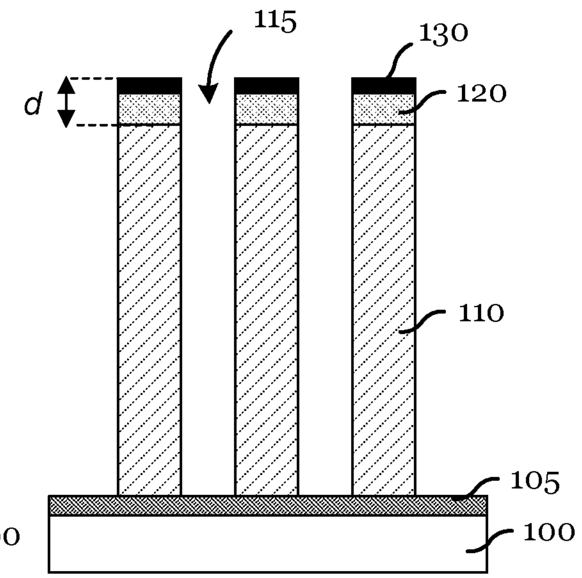

In FIG. 1E, the protective layer 130 may be replenished by performing the second deposition step. The second or any subsequent deposition steps may be performed in the same way as the first deposition step by introducing a deposition gas comprising a deposition precursor to the plasma processing chamber. In various embodiments, after the second or any subsequent deposition step, the thickness of the protective layer 130 may be recovered to a level similar or same as that after the first deposition step. In various embodiments, these cycles of etch and deposition steps may be repeated, for any number of times, to extend the recesses 115 while repeatedly replenishing the protective layer 130 (FIG. 1F). In one or more embodiments, the protective layer 130 may be replenished frequently such that no hardmask material may be consumed after the initial etch step. In certain embodiments, the cycles of etch and deposition steps may be repeated at least twice and up to 10 cycles, but in other embodiments, more cycles may be performed.

FIG. 1F illustrates a cross-sectional view of the substrate 100 after completing the cyclic plasma etch process.

After completing the cyclic plasma etch process, the recesses 115 may reach to the level of the ESL 105, which protects the substrate 100 from being degraded. In various embodiments, the substrate 100 may still comprise a portion of the patterned hardmask layer 120 and the protective layer 130 remaining on the top surface of the conductive layer 110. Having this combined mask materials left even after the cyclic plasma process to etch conductive materials may be beneficial in subsequent fabrication of the downstream operations. For example, the combined mask materials remaining may be used in and improve self-alignment of vias to be formed for interconnects to a next metal layer. In another example, the remaining mask materials may be first patterned and reused for a subsequent line cut step. In certain embodiments, the combined mask materials (i.e., the remaining portions of the hardmask and the protective layer), after the cyclic plasma etch process, may have a thickness d between 5 nm and 20 nm, or 5% and 20% of the thickness of the conductive layer 110.

While FIG. 1F specifically illustrates the patterned hardmask layer 120 and the protective layer 130 remaining on the top surface of the conductive layer 110 after the cyclic plasma etch process, in other embodiments, there may be no mask materials left on the feature. The initial thickness for the hardmask layer and process recipe for the cyclic plasma etch process may be adjusted in consideration of subsequent fabrication processes and whether any mask materials remaining may be useful or not.

In other embodiments, after the cyclic plasma etch process, most of the protective layer 130 may be removed and the combined mask materials may be mostly or entirely the hardmask material (e.g., the patterned hardmask layer 120). The remaining mask material may have a thickness less than the initial thickness of the hardmask material. Even in these embodiments, the protective layer can advantageously minimize the consumption of the hardmask material during the cyclic plasma etch process.

In various embodiments, each cycle of the cyclic plasma etch process may be between 10 sec and 60 sec. In one embodiment, each of the etch and deposition steps may be between 5 sec and 2 min. In certain embodiments, the deposition gas may be pulsed into the plasma processing chamber, thereby quickly switching between the etch and deposition steps at a frequency (e.g., 0.01 Hz-10 kHz).

Further, one or more cycles of the cyclic plasma process may comprise an additional step (e.g., oxygen treatment) besides the etch and deposition steps. In certain embodiments, in one or more cycles of the cyclic plasma process, some steps may be added, skipped, shortened, or prolonged depending on the process recipe or the progress of etching. Accordingly, in one or more embodiments, the process parameters (e.g., process gas composition, gas flow rates, chamber pressure, plasma source power, plasma bias power, plasma pulsing profile, and temperature) may be different from one cycle of the cyclic plasma etch process to another.

In various embodiments, as illustrated in FIG. 1F, the recesses 115 with straight sidewall profiles and uniform CD across the substrate 100 may advantageously achieved in the conductive layer 110 by the cyclic plasma etch process. In contrast, typical process conditions for plasma etching of conductive materials often requires a thick hardmask layer due to poor etch mask selectivity, causing tapering, bowing, and CD variations. One advantage of the methods is that the deposition step may be enabled simply by introducing the deposition precursor to induce in-situ chemical vapor deposition, and may be adapted to current plasma etching tools without substantial system modifications. The balance between etching and deposition may be tuned in consideration of the hardmask budget and process requirement. With the ability to replenish the protective layer, the methods may advantageously extend over-etch margin without consuming all the etch mask.

FIG. 2 illustrates a cross sectional view of another substrate 100 after a first deposition step of the cyclic plasma etch process in accordance with another embodiment.

In prior embodiments as described referring to FIGS. 1B-1F, the cyclic plasma etch process may start with the initial etch step prior to performing the first deposition step. In alternate embodiments, the deposition step to form a protective layer 130 may be performed first. The first deposition step may be applied to the same incoming substrate 100 described in prior embodiments as illustrated in FIG. 1A before forming any recess feature. As a result, a protective layer 130 may be deposited selectively over the top surface of the patterned hardmask layer 120 as illustrated in FIG. 2. This structure is similar to that in FIG. 1C but without the recesses 115. After the first deposition step, the cyclic plasma etch process may proceed with the first etch step to form one or more recesses and then subsequent cycles of deposition and etch steps as previously described (e.g., FIGS. 1D-1F).

This deposition-first method of the cyclic plasma etch process may be particularly advantageous in improving the etch mask selectivity during the first etch step. Further, in one or more embodiments, the initial hardmask layer may be characterized for its thickness after patterning the hardmask, and depending on the initial thickness of the patterned hardmask layer 120, the sequence of the steps may be determined for the cyclic plasma etch process.

FIGS. 3A-3C illustrate process flow charts of methods of cyclic plasma etch process in accordance with various embodiments. The process flow can be followed with the figures (FIGS. 1A-1F) discussed above and hence will not be described again.

In FIG. 3A, a process flow 30 starts with forming a patterned hardmask layer over a conductive layer to be etched (block 310, FIG. 1A). The conductive layer may then be patterned using the patterned hardmask layer as an etch mask by performing a cyclic plasma etch process to gradually form a recess in the conductive layer (block 320, FIGS. 1B-1F). Each cycle of the cyclic plasma etch process may comprise exposing the substrate to a first plasma comprising a halogen to etch the conductive layer (block 330, FIGS. 1B and 1D), and exposing the substrate to a second plasma comprising a silicon-containing precursor to deposit a silicon-containing protective layer over a top surface of the patterned hardmask layer (block 340, FIGS. 1C and 1E).

In FIG. 3B, a process flow 32 starts with forming a patterned hardmask layer over a conductive layer to be etched (block 310, FIG. 1A). Next, a halogen-containing etch gas may be flowed into a plasma processing chamber housing the substrate comprising the conductive layer to be etched (block 321). While flowing the halogen-containing etch gas, a plasma generated from the halogen-containing etch gas may be sustained in the plasma processing chamber (block 322), followed by etching the conductive layer using the patterned hardmask layer as an etch mask by exposing the substrate to the plasma (block 332, FIG. 1B). Subsequently, while flowing the halogen-containing gas, a silicon-containing precursor may be flowed into the plasma processing chamber to modify a composition of the plasma (block 341), followed by depositing a silicon-containing layer over a top surface of the patterned hardmask layer by exposing the substrate to the modified plasma (block 342, FIG. 1C). In various embodiments, these steps of etching and depositing may be repeated (blocks 332 and 342, FIGS. 1D-1E).

In FIG. 3C, a process flow 34 starts with forming a patterned hardmask layer comprising silicon (Si) over a conductive layer to be etched, where the conductive layer comprising ruthenium (Ru) is disposed over a substrate, and the substrate comprises a etch stop layer (ESL) underlying the conductive layer (block 314, FIG. 1A). Subsequently, the conductive layer may be patterned using the patterned hardmask layer as an etch mask by performing a cyclic plasma etch process in a plasma processing chamber to gradually form a recess in the conductive layer (block 324, FIGS. 1B-1F). Each cycle of the cyclic plasma etch process may comprise sustaining a plasma comprising an etchant (block 325), exposing the substrate to the plasma to etch the conductive layer (block 334, FIG. 1B), flowing a silicon-containing precursor to the plasma processing chamber, while the exposing, to form a protective layer over a top surface of the patterned hardmask layer (block 344, FIG. 1C), and stopping the flow of silicon-containing precursor to stop the formation of the protective layer (block 345).

FIG. 4 illustrates a plasma system 400 for performing a process of semiconductor fabrication in accordance with various embodiments.

FIG. 4 illustrates the plasma system 400 for performing a cyclic plasma etch process, for example, as illustrated in the flow diagrams in FIGS. 3A-3C. The plasma system 400 has a plasma processing chamber 450 configured to sustain plasma directly above a substrate 402 loaded onto a substrate holder 410. A process gas may be introduced to the plasma processing chamber 450 through a gas inlet 422 and may be pumped out of the plasma processing chamber 450 through a gas outlet 424. The gas inlet 422 and the gas outlet 424 may comprise a set of multiple gas inlets and gas outlets, respectively. The gas flow rates and chamber pressure may be controlled by a gas flow control system 420 coupled to the gas inlet 422 and the gas outlet 424. The gas flow control system 420 may comprise various components such as high pressure gas canisters, valves (e.g., throttle valves), pressure sensors, gas flow sensors, vacuum pumps, pipes, and electronically programmable controllers. An RF bias power source 434 and an RF source power source 430 may be coupled to respective electrodes of the plasma processing chamber 450. The substrate holder 410 may also be the electrode coupled to the RF bias power source 434. The RF source power source 430 is shown coupled to a helical electrode 432 coiled around a dielectric sidewall 416. In FIG. 4, the gas inlet 422 is an opening in a top plate 412 and the gas outlet 424 is an opening in a bottom plate 414. The top plate 412 and bottom plate 414 may be conductive and electrically connected to the system ground (a reference potential).

The plasma system 400 is by example only. In various alternative embodiments, the plasma system 400 may be configured to sustain inductively coupled plasma (ICP) with RF source power coupled to a planar coil over a top dielectric cover, or capacitively coupled plasma (CCP) sustained using a disc-shaped top electrode in the plasma processing chamber 450. Alternately, other suitable configurations such as electron cyclotron resonance (ECR) plasma sources and/or a helical resonator may be used. The RF-bias power source 570 may be used to supply continuous wave (CW) or pulsed RF power to sustain the plasma. Gas inlets and outlets may be coupled to sidewalls of the plasma processing chamber, and pulsed RF power sources and pulsed DC power sources may also be used in some embodiments. In various embodiments, the RF power, chamber pressure, substrate temperature, gas flow rates and other plasma process parameters may be selected in accordance with the respective process recipe.

Although not described herein, embodiments of the present invention may be also applied to remote plasma systems as well as batch systems. For example, the substrate holder may be able to support a plurality of wafers that are spun around a central axis as they pass through different plasma zones.

Example embodiments of the invention are summarized here. Other embodiments can also be understood from the entirety of the specification as well as the claims filed herein.

Example 1. A method of processing a substrate that includes: forming a patterned hardmask layer over a conductive layer to be etched, the conductive layer disposed over a substrate; and patterning the conductive layer using the patterned hardmask layer as an etch mask, by performing a cyclic plasma etch process to gradually form a recess in the conductive layer, each cycle of the cyclic plasma etch process including exposing the substrate to a first plasma including a halogen to etch the conductive layer, and exposing the substrate to a second plasma including a silicon-containing precursor to deposit a silicon-containing protective layer over a top surface of the patterned hardmask layer.

Example 2. The method of example 1, where the conductive layer includes a refractory metal.

Example 3. The method of one of examples 1 or 2, where the conductive layer includes ruthenium, tungsten, or molybdenum.

Example 4. The method of one of examples 1 to 3, where the patterned hardmask layer includes silicon oxide, silicon nitride, or amorphous silicon.

Example 5. The method of one of examples 1 to 4, where the silicon-containing precursor includes silicon tetrachloride or silicon tetrafluoride.

Example 6. The method of one of examples 1 to 5, where the first plasma includes oxygen and chlorine.

Example 7. The method of one of examples 1 to 6, where an underlying liner layer including nitride underlies the conductive layer, and where, after the cyclic plasma etch process, a top surface of the underlying liner layer is exposed at the bottom of the recess.

Example 8. The method of one of examples 1 to 7, where the recess has an aspect ratio between 3:1 and 6:1 after the cyclic plasma etch process.

Example 9. A method of processing a substrate that includes: forming a patterned hardmask layer over a conductive layer to be etched, the conductive layer disposed over a substrate; flowing a halogen-containing etch gas into a plasma processing chamber, the substrate being loaded in the plasma processing chamber; while flowing the halogen-containing etch gas, sustaining a plasma generated from the halogen-containing etch gas in the plasma processing chamber; etching the conductive layer using the patterned hardmask layer as an etch mask by exposing the substrate to the plasma; while flowing the halogen-containing gas, flowing a silicon-containing precursor into the plasma processing chamber to modify a composition of the plasma; depositing a silicon-containing layer over a top surface of the patterned hardmask layer by exposing the substrate to the modified plasma; and repeating the etching and the depositing.

Example 10. The method of example 9, further including, after depositing the silicon-containing layer, oxidizing the silicon-containing layer.

Example 11. The method of one of examples 9 or 10, where the patterned hardmask layer defines a line pattern having a pitch size between 10 nm and 50 nm, the line pattern being transferred to the conductive layer by the etching.

Example 12. The method of one of examples 9 to 11, where, prior to the etching, the patterned hardmask layer has a first thickness and the conductive layer has a second thickness, the second thickness is at least twice the first thickness.

Example 13. The method of one of examples 9 to 12, where the conductive layer includes ruthenium, and where the halogen-containing etch gas including dichlorine and dioxygen.

Example 14. The method of one of examples 9 to 13, where the conductive layer includes tungsten silicide or tungsten silicon nitride, and where the halogen-containing etch gas including dichlorine and dinitrogen.

Example 15. The method of one of examples 9 to 14, where the conductive layer includes molybdenum, and where the halogen-containing etch gas including dichlorine, tetrafluoromethane, and dioxygen.

Example 16. A method of processing a substrate that includes: forming a patterned hardmask layer over a conductive layer to be etched, the conductive layer disposed over a substrate, the conductive layer including ruthenium, the patterned hardmask layer including silicon, the substrate including a etch stop layer (ESL) underlying the conductive layer; and patterning the conductive layer using the patterned hardmask layer as an etch mask, by performing a cyclic plasma etch process in a plasma processing chamber to gradually form a recess in the conductive layer, each cycle of the cyclic plasma etch process including sustaining a plasma including an etchant, exposing the substrate to the plasma, the etchant etching the conductive layer, while the exposing, flowing a silicon-containing precursor to the plasma processing chamber to form a protective layer over a top surface of the patterned hardmask layer, and stopping the flow of silicon-containing precursor to stop the formation of the protective layer.

Example 17. The method of example 16, where the etchant includes a halogen, and where the silicon-containing precursor includes silicon tetrachloride or silicon tetrafluoride.

Example 18. The method of one of examples 16 or 17, where, after performing the cyclic plasma etch process, a top surface of the ESL is exposed at the bottom of the recess, and at least a portion of the patterned hardmask layer and a portion of the protective layer remain over the conductive layer.

Example 19. The method of one of examples 16 to 18, where the each cycle of the cyclic plasma etch process is between 10 sec and 60 sec.

Example 20. The method of one of examples 16 to 19, where the etchant etches the conductive layer at a first etch rate and the protective layer at a second etch rate, and where the first etch rate is at least twice the second etch rate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:

forming a patterned hardmask layer over a conductive layer to be etched, the conductive layer disposed over a substrate; and patterning the conductive layer using the patterned hardmask layer as an etch mask, by performing a cyclic plasma etch process to gradually form a recess in the conductive layer, each cycle of the cyclic plasma etch process comprising exposing the substrate to a first plasma comprising a halogen to etch the conductive layer, and exposing the substrate to a second plasma comprising a silicon-containing precursor to deposit a silicon-containing protective layer over a top surface of the patterned hardmask layer, wherein the deposition of the silicon-containing protective layer is selective to the top surface of the patterned hardmask layer relative to sidewalls of the conductive layer.

2. The method of claim 1, wherein the conductive layer comprises a refractory metal.

3. The method of claim 1, wherein the conductive layer comprises ruthenium, tungsten, or molybdenum.

4. The method of claim 1, wherein the patterned hardmask layer comprises silicon oxide, silicon nitride, or amorphous silicon.

5. The method of claim 1, wherein the silicon-containing precursor comprises silicon tetrachloride or silicon tetrafluoride.

6. The method of claim 1, wherein the first plasma comprises oxygen and chlorine.

7. The method of claim 1, wherein an underlying liner layer comprising nitride underlies the conductive layer, and wherein, after the cyclic plasma etch process, a top surface of the underlying liner layer is exposed at the bottom of the recess.

8. The method of claim 1, wherein the recess has an aspect ratio between 3:1 and 6:1 after the cyclic plasma etch process.

9. A method of processing a substrate, the method comprising:

forming a patterned hardmask layer over a conductive layer to be etched, the conductive layer disposed over a substrate;

flowing a halogen-containing etch gas into a plasma processing chamber, the substrate being loaded in the plasma processing chamber;

while flowing the halogen-containing etch gas, sustaining a plasma generated from the halogen-containing etch gas in the plasma processing chamber;

etching the conductive layer using the patterned hardmask layer as an etch mask by exposing the substrate to the plasma;

while flowing the halogen-containing etch gas, flowing a silicon-containing precursor into the plasma processing chamber to modify a composition of the plasma;

depositing a silicon-containing layer over a top surface of the patterned hardmask layer by exposing the substrate to the modified plasma, the silicon-containing layer being formed to a first thickness over the top surface of the patterned hardmask layer, the first thickness being greater than a second thickness of the silicon-containing layer over the conductive layer; and repeating the etching and the depositing.

10. The method of claim 9, further comprising, after depositing the silicon-containing layer, oxidizing the silicon-containing layer.

11. The method of claim 9, wherein the patterned hardmask layer defines a line pattern having a pitch size between 10 nm and 50 nm, the line pattern being transferred to the conductive layer by the etching.

12. The method of claim 9, wherein, prior to the etching, the patterned hardmask layer has a third thickness and the conductive layer has a fourth thickness, the fourth thickness being at least twice the third thickness.

13. The method of claim 9, wherein the conductive layer comprises ruthenium, and wherein the halogen-containing etch gas comprises dichlorine and dioxygen.

14. The method of claim 9, wherein the conductive layer comprises tungsten silicide or tungsten silicon nitride, and wherein the halogen-containing etch gas comprises dichlorine and dinitrogen.

15. The method of claim 9, wherein the conductive layer comprises molybdenum, and wherein the halogen-containing etch gas comprises dichlorine, tetrafluoromethane, and dioxygen.

16. A method of processing a substrate, the method comprising:

forming a patterned hardmask layer over a conductive layer to be etched, the conductive layer disposed over a substrate, the conductive layer comprising ruthenium, the patterned hardmask layer comprising silicon, the substrate comprising an etch stop layer (ESL) underlying the conductive layer; and patterning the conductive layer using the patterned hardmask layer as an etch mask, by performing a cyclic plasma etch process in a plasma processing chamber to gradually form a recess in the conductive layer, each cycle of the cyclic plasma etch process comprising sustaining a plasma comprising an etchant, exposing the substrate to the plasma, the etchant etching the conductive layer, while exposing the substrate to the plasma, flowing a silicon-containing precursor to the plasma processing chamber to selectively form a protective layer on a top surface of the patterned hardmask layer relative to sidewalls of the conductive layer and to the surface of the conductive layer, and stopping the flow of silicon-containing precursor to stop the formation of the protective layer.

17. The method of claim 16, wherein the etchant comprises a halogen, and wherein the silicon-containing precursor comprises silicon tetrachloride or silicon tetrafluoride.

18. The method of claim 16, wherein, after performing the cyclic plasma etch process, a top surface of the ESL is exposed at the bottom of the recess, and at least a portion of the patterned hardmask layer and a portion of the protective layer remain over the conductive layer.

19. The method of claim 16, wherein each cycle of the cyclic plasma etch process is between 10 sec and 60 sec.

20. The method of claim 16, wherein the etchant etches the conductive layer at a first etch rate and the protective layer at a second etch rate, and wherein the first etch rate is at least twice the second etch rate.

* * * * *